United States Patent [19]

Chao et al.

[11] 4,279,070
[45] Jul. 21, 1981

[54] METHOD OF MAKING INTEGRATED WAVEGUIDE CAVITIES

[75] Inventors: Chente Chao, Minnetonka, Minn.; Edward M. Nakaji; Robert L. Bernick, both of Torrance, Calif.

[73] Assignee: The United States of America as represented by the Secretary of the Air Force, Washington, D.C.

[21] Appl. No.: 127,017

[22] Filed: Mar. 4, 1980

[51] Int. Cl.³ .............................................. H01P 11/00
[52] U.S. Cl. ....................................... 29/583; 29/601; 29/589; 29/591
[58] Field of Search ...................... 29/576 J, 583, 600, 29/601, 589, 577 R, 591

[56] References Cited

U.S. PATENT DOCUMENTS

| | | | |
|---|---|---|---|
| 3,916,510 | 11/1975 | Martin | 29/583 |
| 4,023,258 | 5/1977 | Carlson et al. | 29/578 |
| 4,023,260 | 5/1977 | Schneider | 29/578 |
| 4,102,037 | 7/1978 | Espaignol et al. | 29/583 |

FOREIGN PATENT DOCUMENTS 2910419  9/1979  Fed. Rep. of Germany ............ 29/583

Primary Examiner—Aaron Weisstuch
Attorney, Agent, or Firm—Donald J. Singer; Henry S. Miller

[57] ABSTRACT

This invention provides a method for forming a waveguide cavity as a step in the process of diode fabrication. Semiconductor diodes are formed in a conventional manner. A plate of waveguide material having a thickness equivalent to waveguide height and slots corresponding to waveguide width is bonded to a semiconductor wafer containing a number of diodes. The slots are formed to correspond to rows of diodes, so that when bonded the diodes are centered in the slot. The package may then be divided as needed and the sides and thickness of the slot form the waveguide.

6 Claims, 3 Drawing Figures

METHOD OF MAKING INTEGRATED WAVEGUIDE CAVITIES

STATEMENT OF GOVERNMENT INTEREST

The invention described herein may be manufactured and used by or for the Government for governmental purposes without the payment of any royalty thereon.

BACKGROUND OF THE INVENTION

The invention relates generally to a method of forming integrated waveguide cavities and in particular to such a method for millimeter-wave, solid-state modules.

The dimensions of waveguide cavities are dependent upon the size of the wave they are required to handle. The longer the wave the larger the hardware needed to move the wave from one location to another, and in general the greater the tolerances and the lower the cost of the equipment. On the other hand, at millimeter-wave frequencies the waveguide cavity dimensions become so small that the cost of machining parts with the required tolerances is very high.

The conventional approach to the problem of manufacturing waveguides in the millimeter range is to machine the waveguide and then mount the solid-state module i.e., a millimeter-wave solid state diode mounted in a separate cavity. Another disadvantage to the conventional process of fabrication is that solid state devices are generally formed with a large number on a single wafer which must then be cut and the individual device incorporated into the waveguide. The smaller the dimensions of the individual pieces the higher the reject rate in the quality control process.

It is therefore more advantageous and less expensive to manufacture a large number of devices having larger dimensions and cut and separate after the manufacturing process is completed.

SUMMARY OF THE INVENTION

The invention provides a new and improved process for the manufacture of integrated waveguide cavities for millimeter-wave frequencies.

It is an object of the invention to eliminate the costly high precision machining steps required to fabricate ultra small waveguide cavities. This object is achieved by fabricating a low cost diode-cavity module suitable for large volume production.

In addition the process has the added feature of providing an integrated device with improved thermal qualities since the entire cavity body ultimately serves as a heat sink for the active solid state device.

An embodiment of the invention forms the integrated waveguide package utilizing impact avalanche and transit time diode (IMPATT) mesas that are formed on a wafer in accordance with well known and accepted fabrication processes. A metal top-plate with a series of slots corresponding to rows of diodes is thermal compression bonded to the semiconductor wafer. The top plate is of a thickness corresponding to waveguide height and the slots have a width corresponding to waveguide width. After the plate is bonded to the wafer, the entire assembly is cut as required, forming an integrated diode waveguide package.

It is another object of the invention to provide a new and improved process for forming integrated waveguide cavities.

It is a further object of the invention to provide a new and improved method of forming integrated waveguide cavities for millimeter-wave solid-state modules.

It is still another object of the invention to provide an improved process for incorporating the formation of a waveguide cavity as a step in the device fabrication procedure.

It is still a further object of the invention to provide a new and improved process suitable for low cost, high volume manufacture of diode-mesas modules in the millimeter-wave lengths.

These and other advantages, features and objects of the invention will become more apparent from the following description taken in connection with the illustrative embodiment in the accompanying drawings.

DESCRIPTION OF THE PREFERRED EMBODIMENT

Figure 1:
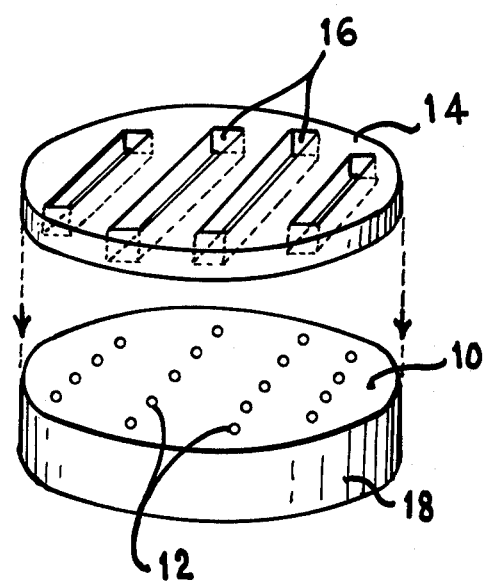
FIG. 1 is an exploded view of the invention.

Referring now to FIG. 1 a semiconductor wafer 10 has a series of IMPATT diode mesas 12 formed thereon. A top plate 14, of a metal appropriate for use as a waveguide and of a thickness equal to a desired waveguide height is prepared to be placed over the wafer. Slots 16 are punched out of the top plate which correspond to the desired width of the waveguide. The slots are aligned so that each slot is centered over a row of diodes. A heat sink 18 of copper or other suitable material is bonded to the wafer in the conventional IMPATT diode fabrication process.

Figure 2:
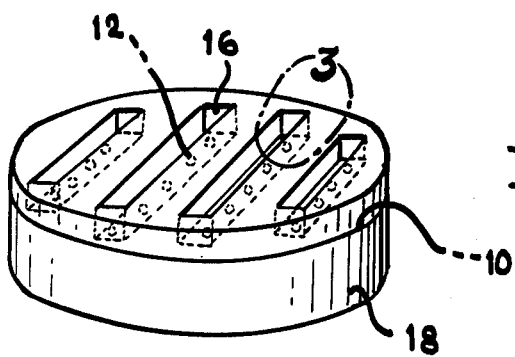
FIG. 2 is a compressed view of the invention.

FIG. 2 shows the top plate as it is thermal compression bonded to the wafer with diode arrays 12 aligned with slots 16. The package thus formed is cut appropriately to form modules which have a width corresponding to the waveguide width.

Figure 3:
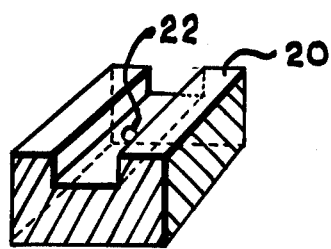
FIG. 3 is a view taken in circle 3 of FIG. 2 of a finished product of the invention.

FIG. 3 shows an integrated waveguide cavity 20 containing an integrated IMPATT diode after separation by cutting from the larger wafer. Leads would be connected to the diode in a conventional manner and fabrication of the module complete. In practice a semiconductor wafer 1½ inch diameter will support approximately 50 modules. The described devices would produce a module appropriate for frequencies from 220 to 325 GH$_z$. The process may also be extended for use with lower millimeter-wave frequencies such as 94 GH$_z$.

Although the invention has been described with reference to a particular embodiment, it will be understood to those skilled in the art that the invention is capable of a variety of alternative embodiments within the spirit and scope of the appended claims.

We claim:

1. A process for fabricating integrated waveguide cavities comprising the steps of: forming a semiconductor device on one side of a wafer; bonding a heat sink to the opposite side of the wafer away from said device; forming a slot in a metal having a thickness equal to a desired waveguide height; placing the metal plate over the surface of the wafer and aligning said slot with said semiconductor device; thermal compression bonding the plate to the wafer, and separating the semiconductor-waveguide cavity module from the remainder of the wafer package by cutting.

2. A process for fabricating integrated waveguide cavities according to claim 1 including forming a plurality of semiconductor devices on said wafer.

3. A process for fabricating integrated waveguide cavities according to claim 2 including forming a plurality of said slots.

4. A process for fabricating integrated waveguide cavities according to claim 3 including forming said slots of a width equal to a desired waveguide width.

5. A process for fabricating integrated waveguide cavities according to claim 4 including the step of separating each semiconductor-waveguide module from other semiconductor-waveguide modules.

6. A process for fabricating integrated waveguide cavities according to claim 5 wherein said semiconductor devices are impact avalanche and transit time diode mesas.

* * * * *